(12) United States Patent
Sumesaglam

(10) Patent No.: US 8,000,672 B2
(45) Date of Patent: Aug. 16, 2011

(54) RAIL-TO-RAIL DATA RECEIVER FOR HIGH-SPEED COMMUNICATION

(75) Inventor: Taner Sumesaglam, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 960 days.

(21) Appl. No.: 11/978,326

(22) Filed: Oct. 29, 2007

(65) Prior Publication Data
US 2009/0111412 A1    Apr. 30, 2009

(51) Int. Cl.
H04B 1/06        (2006.01)
G11C 7/00        (2006.01)
H03F 3/45        (2006.01)

(52) U.S. Cl. .................. 455/252.1; 455/253.1; 455/341; 327/52; 327/57; 365/205; 365/207

(58) Field of Classification Search .............. 455/252.1, 455/253.2, 341; 327/52, 57, 63, 202; 330/253; 365/205, 207, 208
See application file for complete search history.

(56) References Cited

U.S. PATENT DOCUMENTS

| | | | |
|---|---|---|---|
| 5,764,086 A * | 6/1998 | Nagamatsu et al. ............. | 327/65 |
| 6,198,682 B1 * | 3/2001 | Proebsting .................... | 365/207 |
| 6,717,448 B2 * | 4/2004 | Heo et al. ....................... | 327/202 |
| 6,756,823 B1 * | 6/2004 | Chen et al. ....................... | 327/52 |
| 6,940,315 B2 * | 9/2005 | Wang et al. ..................... | 327/52 |
| 6,965,262 B2 * | 11/2005 | Zerbe ............................ | 327/336 |
| 7,057,421 B2 * | 6/2006 | Shi et al. .......................... | 327/55 |
| 7,362,153 B2 * | 4/2008 | Sumesaglam ................. | 327/202 |
| 7,635,994 B1 * | 12/2009 | Wadhwa ......................... | 327/63 |
| 7,768,330 B2 * | 8/2010 | Yuuki et al. .................... | 327/201 |
| 2002/0084838 A1 * | 7/2002 | Martin et al. ................. | 327/560 |
| 2006/0061405 A1 * | 3/2006 | Zerbe ............................. | 327/336 |
| 2007/0072568 A1 | 3/2007 | Sumesaglam et al. ........ | 455/230 |
| 2007/0236258 A1 * | 10/2007 | Kiziloglu et al. .............. | 327/55 |

OTHER PUBLICATIONS

U.S. Appl. No. 11/415,590, filed May 1, 2006, entitled Receiver Latch Circuit and Method, by Taner Sumesaglam.

Mel Bazes, "Two Novel Fully Complementary Self-Biased CMOS Differential Amplifiers," Feb. 1991, pp. 165-168.

* cited by examiner

*Primary Examiner* — Duc M Nguyen
(74) *Attorney, Agent, or Firm* — Trop, Pruner & Hu, P.C.

(57) ABSTRACT

In one embodiment, the present invention includes a receiver having two complementary input sense amplifiers to receive, amplify and latch a differential signal and to output complementary stage differential output signals to a latch coupled to receive and combine the n– them into a latched differential output signal. Other embodiments are described and claimed.

17 Claims, 2 Drawing Sheets

RAIL-TO-RAIL DATA RECEIVER FOR HIGH-SPEED COMMUNICATION

BACKGROUND

Receiver latch circuits (sense amplifiers) are extensively used in integrated circuits (ICs) both for inter-chip and off-chip signaling. A transmitter circuit (driver) sends binary data signals through a transmission line (interconnect) to the receiver latch circuit. Since the transmission line may be a lossy channel, data transfer through the transmission line at high rates may result in frequency-dependent attenuation or loss which causes signal distortion in the form of intersymbol interference (ISI). Further, receiver sensitivity is dependent on a common mode (CM) level of the incoming (differential) signal.

The common mode can be overcome by using a direct current (DC) block circuit, i.e., a bypass capacitor. However, a DC block circuit degrades the signal integrity and imposes constraints on the data channel such as keeping high-low density at a certain level by decoding the sent data. Also the capacitor consumes area. Moreover, such solutions do not have true rail-to-rail operation and are not suitable for low voltage signaling. Other solutions such as a complementary input folded cascade amplifier typically consume high power.

DETAILED DESCRIPTION

Embodiments provide a data receiver circuit with rail-to-rail common-mode range. The circuit shows good voltage sensitivity (10-20 millivolts (mV)) for input common mode range (Vcm) of 0.1 volts (V)–1V. The circuit consumes only 180 microamperes (uA) within this Vcm range. As will be described below, the circuit utilizes both an n-channel metal-oxide semiconductor (NMOS)-input sense amplifier and a p-channel metal-oxide semiconductor (PMOS)-input sense amplifier and a following reset-set (RS) latch to combine the outputs of these two complementary sense amplifiers.

A clock-to-output delay (TCO) of a sense amplifier-based latch can be written as:

$$TCO = to + \frac{CL}{gml} \ln\left(\frac{2Vdd \cdot CL/(gm \cdot to)}{Vin}\right) \quad [\text{EQ. 1}]$$

where Vin, gml, gm, to, CL are differential input voltage, positive feedback transconductance, input transconductance, evaluation time, and load capacitance respectively. Note that gm is sensitive to the input common mode due to non-linear behavior of a sense amplifier. As Vcm goes lower, gm drops dramatically and the current supplied by the tail transistor cuts off eventually and the circuit does not work. For a P-input sense amplifier, a reverse action can be observed. Thus for individual N-input and P-input latches, the TCO becomes unacceptably high when the common mode input approaches ground and supply voltage levels, respectively. Thus embodiments may combine the two latches with a common reset-set (RS) latch to enable operation over a much larger Vcm range, e.g., from approximately 0.1-1.1 volts.

Figure 1:
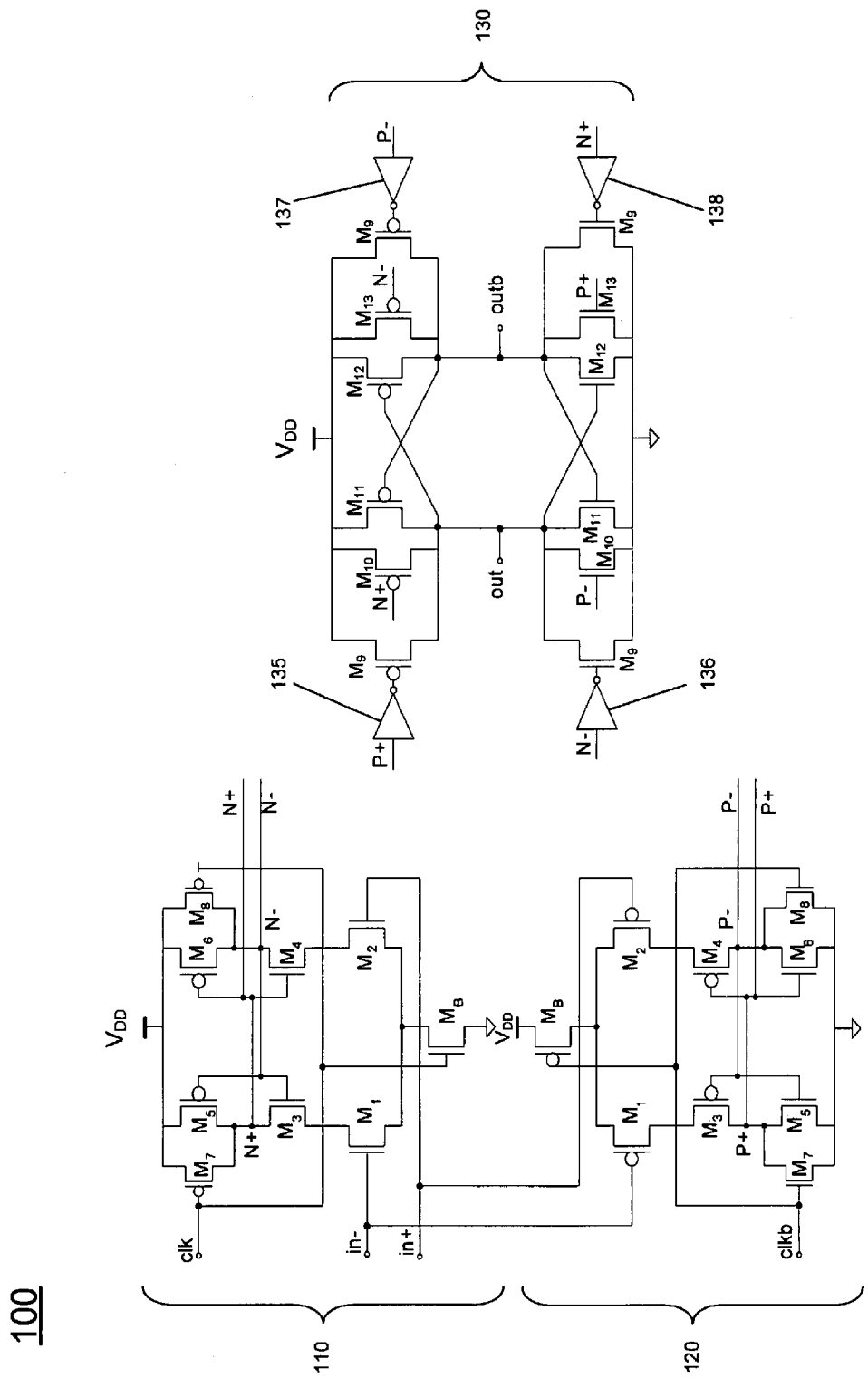
FIG. 1 is a schematic diagram of a receiver in accordance with one embodiment of the present invention.

Referring now to FIG. 1, shown is a schematic diagram of a receiver in accordance with one embodiment of the present invention. As shown in FIG. 1, receiver 100 may include a pair of complementary sense amplifiers 110 and 120, respectively, and a latch 130 to which the outputs of sense amplifiers 110 and 120 are coupled.

Amplifiers 110 and 120 may amplify a received differential input data signal in+/in− on the rising edge of a clock signal clk to generate amplified output data signals N+/N− and P+/P− and may hold the output data signals for half of a clock period of the clock signal clk. RS latch 130 may receive the output data signals from the amplifiers 110 and 120 and hold (latch) the combined output valid for a whole clock period.

In some embodiments, the input data signal may be a small swing or low voltage swing signal. The voltage of the small swing, data input signal may have been reduced so that when it is transmitted over an interconnect to the receiver latch circuit 100, performance is improved. The receiver latch circuit 100 may restore the input data signal to a full rail-to-rail ("full rail") output data signal. In some embodiments, the input signal may be a differential signal, where both the data signal and its complement are transmitted, as shown in FIG. 1. In these embodiments, the receiver latch circuit 100 detects a relative change in voltage between two interconnect wires, with the input data signal being applied across the two interconnect wires and therefore across illustrated input nodes in+ and in− as shown in FIG. 1. Hence, the value of the input data signal may be the voltage difference between a voltage at node in+ and a voltage at node in−.

In general, the receiver latch circuit 100 may have three distinct periods of operations: a precharge period, an evaluation period, and an amplification and latching period. In some embodiments, precharging of the amplifiers 110 and 120 may occur as long as the clock signal clk is low and the clock complement signal clkb is high (first clock phase), which defines a precharge period. During the precharge period, the output data signal of amplifier 110 may be shorted to a supply voltage Vdd and the output data signal of amplifier 120 may be shorted to a reference voltage, e.g., a ground level. The output data signal of amplifier 110 is the voltage across output nodes n+ and n− (output terminals of amplifier 110) and the output data signal of amplifier 120 is the voltage across output nodes p+ and p− (output terminals of amplifier 120). The parasitic capacitances associated with the output nodes and sense nodes of the amplifiers may be precharged. In general, any components connected to these nodes may contribute to the capacitance that is precharged.

In the embodiment of FIG. 1, amplifier 110 is an n-input sense amplifier, while amplifier 120 is a p-input sense amplifier. As shown, the incoming differential signal pair in+ and in− is provided to amplifiers 110 and 120. More specifically, the input signal pair is provided to metal oxide semiconductor field effect transistors (MOSFETs) M1 and M2 of amplifiers 110 and 120. Note that in the embodiment of FIG. 1 MOSFETs M1 and M2 of amplifier 110 are n-channel MOSFETs (nMOSFETs), while MOSFETs M1 and M2 of amplifier 120 are p-channel MOSFETs (pMOSFETs). In turn, each MOSFET pair (M1 and M2) is biased by bias transistors MB, respectively. These transistor pairs (and bias transistors MB) may act as evaluation circuits.

The evaluation circuits may be further coupled to transistors M3 and M4 which act to amplify the incoming signal and provide corresponding differential outputs N+/N− and P+/P− at output nodes N+ and N− and P+ and P−. Note that in turn output transistors M3 and M4 are each coupled to a differential pair of transistors M5/M7 and M6/M8 which are gated, respectively by an incoming clock signal clk and the output terminal of the oppositely coupled output transistor. These transistor pairs may act as a control circuit to precharge the outputs nodes and to enable rail-to-rail outputs N+ and N−.

In some embodiments, two interconnect lines may be coupled to the input nodes in+ and in− of MOSFETs M1 and M2 to apply the input data signal. As the clock signal clk transitions from low to high, an evaluation period may be initiated by the rising edge of the clock signal. During the evaluation period, the input data signal may be evaluated by MOSFETs M1 and M2 to produce at its output nodes a sensed data signal, which is the voltage difference across the sense nodes.

MOSFETs M3 and M4 may amplify the sensed data signal to a full rail-to-rail, output data signal and may hold (latch) the signal during a second clock phase of the clock signal clk. The beginning of the amplification of the sensed signal ends the evaluation period and begins an amplification and latching period. Thereafter, latch 130 may latch the combined differential output signal for a whole clock period of the clock signal clk.

During operation, when the clock signal clk is low, the output node N+ is precharged to the supply voltage (VDD), as MOSFETs M7 and M8 are gated by the low clock signal (note that output N− is also precharged to the supply voltage in this condition as MOSFETs M5 and M6 are gated off). At the same time, the inverted clock signal (i.e., clkb) is at a high level, causing MOSFETs M7 and M8 of sense amplifier 120 to be gated on, in turn causing the output P+ to be charged to a ground level. In turn, MOSFETs M5 and M6 of sense amplifier 120 are gated off so that the output signal P− is also precharged to ground.

Then when the clock signal is activated high, transistor MB of sense amplifier 110 is enabled so that the sources of MOSFETs M1 and M2 are at a ground level. The input signal pair in+ and in− gate MOSFETs M1 and M2 and the drain terminals are connected to MOSFETs M3 and M4 which when gated, provide the amplified output signals N+ and N−. Sense amplifier 120 operates in a manner such that if N+ is high and N− is low, P+ is high and P− is low.

When the outputs from sense amplifiers 110 and 120 are large enough such as when they are sufficiently close to CMOS levels, latch 130 may combine the outputs to provide the differential output pair out/outb. Then when the clock signal goes inactive, latch 130 operates to hold the data output signal for the full clock period. More specifically, sense amplifier 110 has its output signals N− and N+ provided to a pair of inverters 136 and 138, respectively, while in turn sense amplifier 120 has its output signals P+ and P− coupled to inverters 135 and 137, respectively. Each inverter gates an input transistor M9. Furthermore, the non-inverted N and P output signals are provided to additional input transistors M10 and M13, as shown in FIG. 1. Coupled in parallel with these input transistors are a plurality of output transistors M11 and M12 which have output terminals cross coupled with gate terminals as shown in FIG. 1, to provide a complementary output signal, out/outb. Latch 130 may act as a RS latch to thus provide a latched output corresponding to the differential input signal, where the latch acts to hold its output for a full clock period. While shown with this particular implementation in the embodiment of FIG. 1, the scope of the present invention is not limited in this regard.

Embodiments may consume very low power (<180 uA) while showing good voltage sensitivity (<20 mV) over a large common mode range (approximately 0.1V to approximately 1.0V) along with a TCO less than approximately 0.25 nanoseconds. Further, embodiments may enable more flexibility to IO circuits as far as signaling, the termination and driver architecture as the termination and IO voltages shrink.

Figure 2:
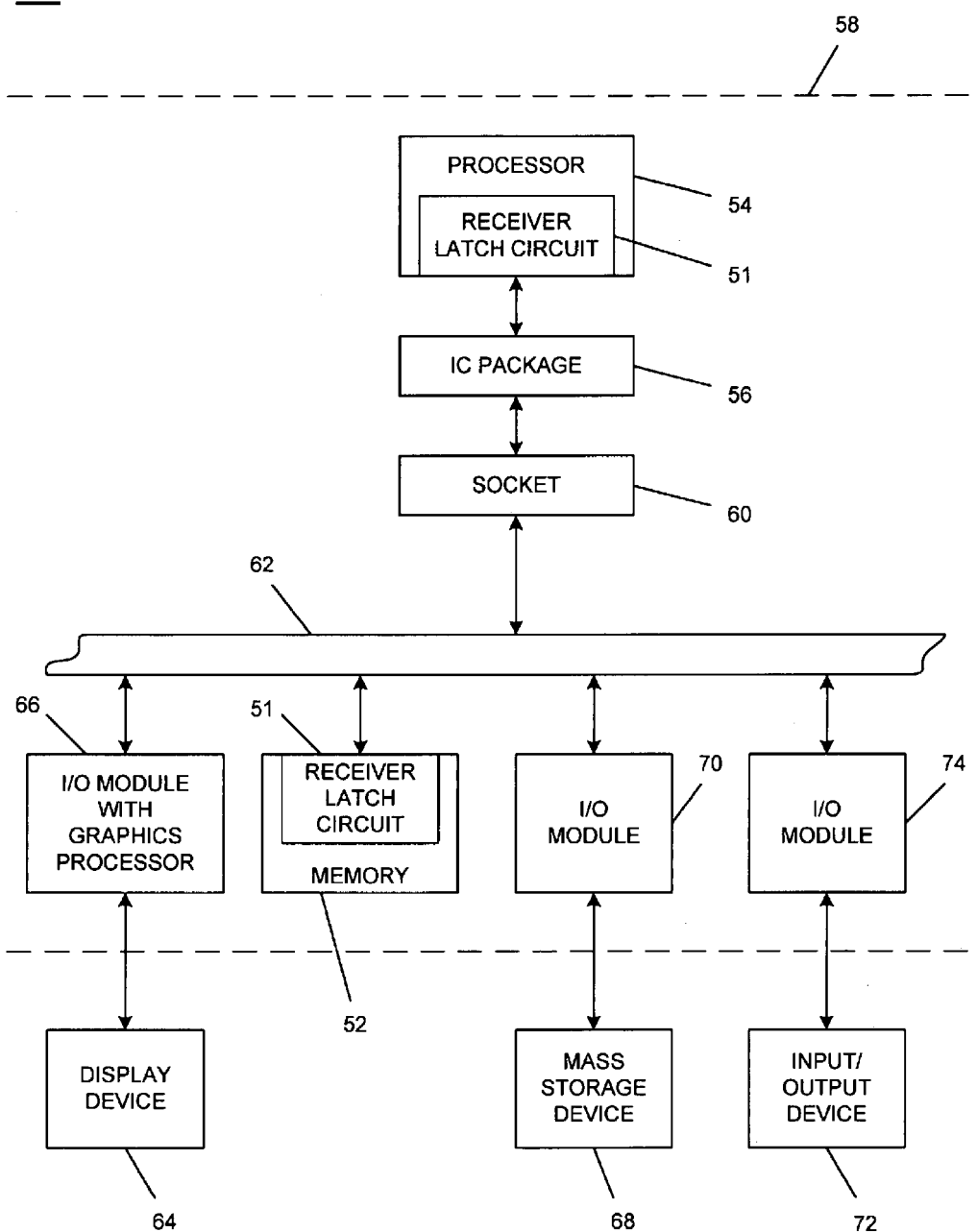
FIG. 2 is an illustration of a computer system in accordance with one embodiment of the present invention.

Referring to FIG. 2, there is illustrated a computer system 50, according to some embodiments of the present invention, which is one of many possible systems in which one or more receiver latch circuits 51 may be used. In some embodiments, each of the receiver latch circuits 51 may be the receiver latch circuit 100 of FIG. 1. In some embodiments, one or more receiver latch circuits 51 may be used in a memory chip 52, and/or one or more receiver latch circuits 51 may be used in a processor chip 54. In some embodiments, the one or more receiver latch circuits may be used in other integrated circuit (IC) chips of the computer system 50. ICs, such as the memory chip 52 and the processor chip 54, may have upwards of several hundred transmission lines in input/output buses with associated transmitter (driver), receiver, and/or transceiver circuits. In some embodiments, the receiver latch circuit 51 may receive off-chip signals and/or on-chip (interchip) signals. In other words, the driver transmitting the input data signal to the receiver latch circuit 51 may be in the same chip (on-chip signals) or different chip (off chip signals). The receiver latch circuit 51 is applicable to systems other than computer systems, and the computer system 50 is merely illustrative of one application.

In the system 50, an IC package 56 is mounted on a substrate or printed circuit board (PCB) 58 via a socket 60. The PCB 58 may be a motherboard. In addition to the socket 60 and the IC package 56, the PCB 58 may have mounted thereon the main memory 52 and a plurality of input/output (I/O) modules for external devices or external buses, all coupled to each other by a bus system 62 on the PCB 58. More specifically, the system 50 may include a display device 64 coupled to the bus system 62 by way of an I/O module 66, with the I/O module 66 having a graphical processor and a memory. The I/O module 66 may be mounted on the PCB 58 or may be mounted on a separate expansion board. The system 50 may further include a mass storage device 68 coupled to the bus system 62 via an I/O module 70. Another I/O device 72 may be coupled to the bus system 62 via an I/O module 74. Additional I/O modules may be included for other external or peripheral devices or external buses. While shown with this particular implementation in the embodiment of the FIG. 2, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   an n-input sense amplifier including an input stage having first n-channel metal-oxide-semiconductor field effect transistors (nMOSFETs) gated by a differential input signal, an output stage having second nMOSFETs to output an n-stage differential output signal at an output node, and a control stage including p-channel MOSFETs (pMOSFETs) gated at least in part by a clock signal, wherein the control stage is to gate the output stage;
   a p-input sense amplifier including an input stage having first pMOSFETs gated by the differential input signal, an output stage having second pMOSFETs to output a p-stage differential output signal at an output node, and a control stage including nMOSFETs gated at least in part by an inverted clock signal, wherein the control stage is to gate the output stage; and a latch coupled to receive and combine the n-stage differential output signal and the p-stage differential output signal and to generate a latched complementary output signal therefrom.

2. The apparatus of claim 1, wherein the latched complementary output signal is a full rail-to-rail output complementary signal.

3. The apparatus of claim 2, wherein the latch includes a plurality of inverters each to receive one part of the n-stage differential output signal or the p-stage differential output signal, an output of each of the plurality of inverters to gate one of a first set of input transistors of the latch.

4. The apparatus of claim 3, wherein the latch further includes a second set of input transistors each gated by one part of the n-stage differential output signal or the p-stage differential output signal, and a plurality of output transistors coupled to a latch output node to provide the latched complementary output signal.

5. The apparatus of claim 1, wherein the control stage of the n-input sense amplifier is to pre-charge the output node to a supply voltage when the clock signal is at a low level.

6. The apparatus of claim 5, wherein the control stage of the p-input sense amplifier is to pre-charge the output node to a ground voltage when the inverted clock signal is at a high level.

7. The apparatus of claim 6, further comprising a first bias transistor coupled between the ground voltage and the first nMOSFETs, the first bias transistor gated by the clock signal, and a second bias transistor coupled between the supply voltage and the first pMOSFETs, the second bias transistor gated by the inverted clock signal.

8. The apparatus of claim 1, wherein the n-input sense amplifier is to operate at a greater sensitivity than the p-input sense amplifier if a common mode level of the differential input signal is closer to a supply voltage than to a ground voltage, and the p-input sense amplifier is to operate at a greater sensitivity than the n-input sense amplifier if the common mode level is closer to the ground voltage than to the supply voltage.

9. A system comprising:
a first semiconductor device to transmit a differential signal; and
a second semiconductor device coupled to the first semiconductor device and including a rail-to-rail receiver to receive the differential signal, the rail-to-rail receiver including an n-input sense amplifier to receive, amplify and latch the differential signal to output an n-stage differential output signal at a first differential output node, a p-input sense amplifier to receive, amplify and latch the differential signal to output a p-stage differential output signal at a second differential output node, and a latch coupled to receive and combine the n-stage differential output signal and the p-stage differential output signal to generate a latched output signal therefrom, wherein the n-input sense amplifier is to operate at a greater sensitivity than the p-input sense amplifier if a common mode voltage of the differential signal is closer to a supply voltage than to a ground voltage, and the p-input sense amplifier is to operate at a greater sensitivity than the n-input sense amplifier if the common mode voltage is closer to the ground voltage than to the supply voltage.

10. The system of claim 9, wherein the latch includes a plurality of inverters each to receive one part of the n-stage differential output signal or the p-stage differential output signal, an output of each of the plurality of inverters to gate one of a first set of input transistors of the latch, a second set of input transistors each gated by one part of the n-stage differential output signal or the p-stage differential output signal, and a plurality of output transistors coupled to a latch output node to provide the latched output signal.

11. The system of claim 10, wherein the n-input sense amplifier includes an input stage having first n-channel metal-oxide-semiconductor field effect transistors (nMOSFETs) gated by the differential signal, an output stage having second nMOSFETs to output the n-stage differential output signal at the first differential output node, and a control stage including p-channel MOSFETs (pMOSFETs) gated at least in part by a clock signal, wherein the control stage is to gate the output stage.

12. The system of claim 11, wherein the control stage of the n-input sense amplifier is to pre-charge the first differential output node to a supply voltage when the clock signal is at a low level.

13. The system of claim 12, further comprising a first bias transistor coupled between a reference voltage and the first nMOSFETs, the first bias transistor gated by the clock signal.

14. The system of claim 9, wherein a clock-to-output delay of the rail-to-rail receiver is less than approximately 0.25 nanoseconds when the common mode voltage of the differential signal is approximately 1 volt or less.

15. A method comprising:
receiving a differential input signal in an n-input sense amplifier including a first input stage having first n-channel metal-oxide-semiconductor field effect transistors (nMOSFETs), outputting an n-stage differential output signal at an output node of a first output stage having second nMOSFETs, and gating the output stage via a first control stage including p-channel MOSFETs (pMOSFETs) gated at least in part by a clock signal;
receiving the differential output signal in a p-input sense amplifier including a second input stage having first pMOSFETs, outputting a p-stage differential output signal at an output node of a second output stage having second pMOSFETs, and gating the output stage via a second control stage including nMOSFETs gated at least in part by an inverted clock signal; and
receiving and combining the n-stage differential output signal and the p-stage differential output signal in a latch and generating a latched complementary output signal therefrom.

16. The method of claim 15, wherein the latched complementary output signal is a full rail-to-rail output complementary signal.

17. The method of claim 16, further comprising receiving one part of the n-stage differential output signal or the p-stage differential output signal in each of a plurality of inverters, and gating one of a first set of input transistors of the latch with an output of each of the plurality of inverters.

* * * * *